United States Patent [19]
Carlson et al.

[11] Patent Number: 4,575,761
[45] Date of Patent: Mar. 11, 1986

[54] AFT ARRANGEMENT FOR A DOUBLE CONVERSION TUNER

[75] Inventors: David J. Carlson; Juri Tults, both of Indianapolis, Ind.

[73] Assignee: RCA Corporation, Princeton, N.J.

[21] Appl. No.: 489,306

[22] Filed: Apr. 28, 1983

[51] Int. Cl.[4] .......................... H04N 5/44; H04B 1/26
[52] U.S. Cl. ............................ 358/191.1; 358/195.1; 455/182; 455/315; 455/316
[58] Field of Search ............... 358/191.1, 193.1, 195.1; 455/314, 315, 316, 182, 192, 189

[56] References Cited

U.S. PATENT DOCUMENTS

| | | | |
|---|---|---|---|
| 3,619,492 | 11/1971 | Evans | 358/195.1 |
| 4,031,549 | 6/1977 | Rast et al. | 358/193.1 |
| 4,322,856 | 3/1982 | Ohta et al. | 455/189 |
| 4,340,974 | 7/1982 | Cooke et al. | 455/258 |
| 4,352,209 | 9/1982 | Ma | 455/315 |
| 4,357,632 | 11/1982 | French | 358/191.1 |
| 4,402,089 | 8/1983 | Knight | 455/191 |
| 4,408,348 | 10/1983 | Theriault | 455/315 |

OTHER PUBLICATIONS

"An Experimental Parametric Tuner for UHF Television Receivers" by L. A. Harwood and T. Murakami appearing in RCA Review Magazine, Jun. 1963, pp. 253–281.

*Primary Examiner*—Tommy P. Chin

[57] ABSTRACT

A double conversion tuner stabilized against drift includes a first local oscillator included in a phase locked loop (PLL) and a second local oscillator included in an automatic fine tuning (AFT) loop. A switching arrangement selectively allows the AFT signal to control the second local oscillator only when the operation of the PLL has been completed and if the picture carrier of the IF signal produced at the output of the tuner is within the AFT control range to prevent the second local oscillator from being tuned incorrectly.

16 Claims, 7 Drawing Figures

AFT ARRANGEMENT FOR A DOUBLE CONVERSION TUNER

BACKGROUND OF THE INVENTION

1. Field of the Invention

This invention concerns a double conversion tuner and in particular an arrangement whereby both local oscillators of the tuner are substantially stabilized with respect to frequency drift.

2. Description of Related Art

Due to the ever increasing popularity of cable television systems, television receiver manufacturers have had to provide tuners capable of tuning cable as well as broadcast channels. The increased number of channels has increased the possibility for the generation of interference signals by the tuner itself due to cross and intermodulation. While single conversion tuners, i.e., tuners which directly heterodyne (or "mix") selected RF signals to the standard IF range (approximately between 41 and 46 MHz in the United States), can be made to tune both cable as well as broadcast channels with acceptable interference levels, the amount of circuitry required to do so is considerably increased with respect to that required for broadcast channels only. Accordingly, double conversion tuners, i.e., tuners which first heterodyne selected RF signals to produce a first IF signal and then heterodyne the first IF signal to produce a second IF signal in the conventional IF frequency range, have been found to be less expensive than single conversion tuners for tuning cable as well as broadcast channels with acceptable interference levels. This is so since the first IF range can be selected with relative freedom to minimize the generation of interference signals.

In a conventional double conversion tuner there is a first local oscillator for generating a first local oscillator signal with a controllable frequency set in accordance with the selected channel so that the first heterodyning operation causes the first IF signal to be within the preselected first IF frequency range and a second local oscillator for generating a second local oscillator signal with a fixed frequency set so that the second heterodyning operation causes the second IF signal to be within the conventional IF frequency range. The first local oscillator may be a voltage controlled oscillator (VCO) employing a voltage variable capacitance ("varactor") diode which is included in a phase locked loop (PLL) for generating the control voltage for the VCO in accordance with the selected channel. Specifically, the PLL causes the VCO to have a frequency proportionally related to the frequency of a reference frequency signal derived from the output signal of a crystal oscillator by a number determined by the channel number of the selected channel. Because crystal oscillators are extremely stable and accurate, the frequency of the first local oscillator signal is also extremely stable and accurate. While the second local oscillator can also be made stable and accurate by making it a crystal oscillator or including it in a PLL, this is expensive. Accordingly, the second local oscillator is typically made a simple L-C oscillator and is therefore subject to the instability (or "drift") of such oscillators. The drift of the second local oscillator may cause the frequencies of the carriers (i.e., in a television receiver, the picture, color and sound carriers) of the second or conventional IF signal to be offset from their correct or nominal values to the degree that the reproduced image or audio responses may be distorted.

Prior to the advent of phase locked loop tuning control systems, in conventional single conversion tuners, an automatic fine tuning (AFT) signal representing the frequency deviation of the picture carrier of the IF signal was coupled to the local oscillator to correct for its frequency drift. Theoretically, a PLL tuning control system makes the use of an AFT signal unnecessary. However, even where a PLL controls the local oscillator, an AFT signal is often used to control the local oscillator frequency in conjunction with the PLL. This is so because the AFT signal makes it possible to tune RF signals provided by a cable system or a television accessory which, by its operation, may shift or offset the frequencies of RF signals from their nominal or correct values by unpredictable amounts. In essence, the AFT signal is used to offset the local oscillator frequency from the nominal value for the selected channel by an amount necessary to compensate for the frequency offset of the corresponding RF signal.

If the same type of AFT local oscillator control arrangement used in a single conversion tuner is adopted for controlling the first local oscillator of a double conversion tuner in order to correct for RF frequency offsets, the frequency drift of the second local oscillator will, at least in part, also be corrected. This is so because the frequency drift of the second local oscillator is manifested in the second or conventional IF signal (from which the AFT signal is derived) and is counteracted by appropriate changes of the frequency of the first local oscillator signal in response to the AFT signal. However, the frequency drift of the second local oscillator may be so large that the AFT signal cannot control the first local oscillator sufficiently to correct for the accumulated effect of the RF frequency offset and the frequency drift of the second local oscillator. Moreover, this problem is compounded by the fact that the effectiveness of the AFT signal to control the first local oscillator (or the "AFT sensitivity") changes from channel to channel and from tuning band to tuning band. This is so because the control voltage versus channel (or frequency) characteristic of a voltage controlled oscillator is not linear and, in general, a greater change in AFT voltage is required at higher channels than at lower channels to produce a given frequency change. In addition, since the frequency of the first local oscillator signal is changed to compensate for the frequency drift of the second local oscillator, the frequency of the first IF signal will also be changed. If the bandwidth of the first IF section has a narrow passband, e.g., to reduce noise or when a surface acoustic wave device is employed, frequency changes of the first local oscillator signal to compensate for the frequency drift of the second local oscillator may bring the first IF signal outside the passband of the first IF section.

SUMMARY OF THE INVENTION

In accordance with the present invention, the first and second local oscillators of a double conversion tuner are both made controllable local oscillators responsive to respective tuning control signals. The first local oscillator is included in a first closed loop control system, such as a phase or frequency locked loop, which generates the tuning control signal for the first local oscillator in accordance with the selected channel. The second local oscillator is included in a second or automatic fine tuning (AFT) closed loop control system which generates an AFT control signal for the second controlled local oscillator in accordance with the frequency deviation of a predetermined carrier, such as the picture carrier in a television receiver, of the second or conventional IF signal produced at the output of the double conversion tuner. In such a system not only are both local oscillators substantially stabilized against drift but the aforementioned problem of variations of the AFT sensitivity as a function of the channel selected is eliminated.

Further, in accordance with the present invention, a switching arrangement is provided for selectively allowing the AFT signal to control the second local oscillator only when the operation of the first closed loop control system for the first local oscillator has been stabilized. This inhibits the second local oscillator from being tuned to an unwanted signal which might otherwise occur if the second local oscillator is allowed to respond to the AFT signal which changes unpredictably in response to changes of the frequency of the first local oscillator signal before the operation of the control system for the first local oscillator is stabilized.

In accordance with a further aspect of the present invention, a detecting arrangement is provided for determining whether or not the frequency of the predetermined carrier has been brought within a predetermined range of its nominal value by the first closed loop's control of the first local oscillator. If not, the first closed loop control system is caused to change the frequency of the first local oscillator signal. When the first closed loop control system has brought the predetermined carrier within the predetermined range, the AFT signal is allowed to control the second local oscillator. In this manner the double conversion tuning system is capable of tuning RF signals having frequency offsets greater than that afforded by the AFT signal consistent with the object of stabilizing both local oscillators against drift.

BRIEF DESCRIPTION OF THE DRAWING

These and other aspects of the present invention will be described with reference to the accompanying drawing in which.

DETAILED DESCRIPTION OF THE PREFERRED EMBODIMENTS

Figure 1:
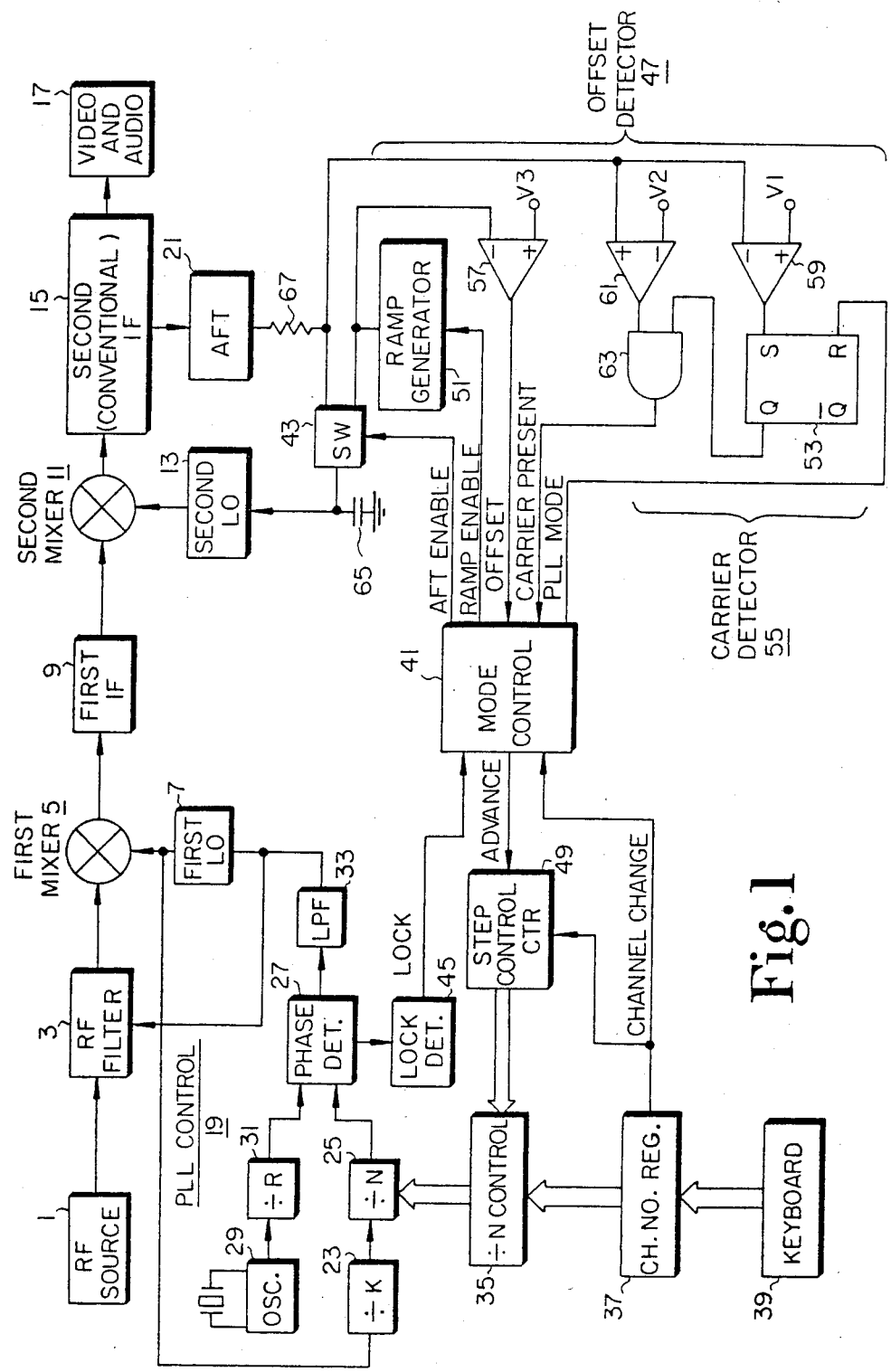
FIG. 1 is a schematic, partially in block form, of a double conversion tuning system of a television receiver including an embodiment of the present invention.

The double conversion tuning system of the television receiver shown in FIG. 1 receives RF signals from an RF source 1 which may, for example, be a broadcast receiving antenna, a cable distribution network or a television accessory such as a video tape or disk player, TV game, home computer or teletext system. The double conversion tuner includes an RF section 3, a first mixer 5, a first local oscillator 7, a first IF section 9, a second mixer 11, a second local oscillator 13 and a second IF section 15 arranged in conventional fashion, for example, as described in U.S. patent application Ser. No. 294,133, entitled "Tuning System for a Television Receiver", filed in the name of G. E. Theriault on Aug. 19, 1981, now issued as U.S. Pat. No. 4,408,348, and assigned to the same assignee as the present application. The frequency range of the first intermediate frequency signal produced by first mixer 5 is selected in order to minimize the generation of interference signals. As disclosed in the Theriault application, a suitable choice for the passband of first IF section 9 is approximately between 411 and 416 MHz with a nominal picture carrier frequency of 415.75 MHz. The passband of second IF section 15 is that of a conventional IF section of a single conversion tuner. For example, in the United States the passband of second IF section 15 is approximately between 41 and 46 MHz with a nominal picture carrier frequency of 45.75 MHz. The second IF signal, after being filtered and amplified by second IF section 15, is applied to a conventional video and audio signal processing section 17 of the television receiver.

In the present double conversion tuning system first local oscillator (LO) 7 and second local oscillator (LO) 13 are both voltage controlled oscillators, including e.g., varactor diodes as tuning elements, and are included within respective closed tuning control loops. First LO 7 is controlled in response to a tuning control voltage generated by phase lock loop (PLL) tuning control system 19 in accordance with the selected channel. Second LO 13 is controlled in response to an automatic fine tuning (AFT) voltage representing the deviation of the frequency of the picture carrier of the second or standard IF signal from its nominal value, e.g., 45.75 MHz. The AFT voltage is generated by a conventional AFT circuit 21 coupled to second IF section 15. As shown in FIG. 1B, the AFT voltage has an S-shaped amplitude versus frequency characteristic which is above a DC reference level (VR) corresponding to the correct or nominal frequency ($f_{NIF2}$) of the carrier of the second IF signal (e.g., 45.75 MHz in the United States) when the frequency deviation has one sense (e.g., negative) and below the DC reference level when the frequency deviation has the opposite sense (e.g., positive).

Phase lock loop tuning control system 19 a fixed divider or prescaler ($\div K$) 23 and a programmable divider ($\div N$) 25 for dividing the frequency of the first LO signal to produce a frequency divided version of the first LO signal which is applied to a first input of a phase detector 27. The frequency of a very stable and accurate crystal oscillator 29 is divided by a fixed divider ($\div R$) 31 to produce a reference frequency signal which is applied to a second input of phase detector 27. Phase detector 27, by means of phase comparison, generates an error signal at its output which represents the frequency deviation between the frequency divided version of the first LO signal applied to its first input and the reference frequency signal applied to its second input. The error signal includes positive and negative going pulses which by their polarity and width represent the sense and magnitude of the frequency deviation. The error pulses are filtered by a low pass filter (LPF) 33 and applied at the tuning control voltage input of first LO 7. The tuning control voltage is changed until the frequencies of the frequency divided LO signal and the reference signal applied to phase detector 27 are substantially equal. At that point the frequency of the first LO is accurately locked to the frequency of the crystal oscillator 29 in a proportional relationship defined by the following equation:

$$f_{LO1} = NK/R \, f_{XTAL}$$

where $f_{LO1}$ is the frequency of first LO, $f_{XTAL}$ is the frequency of crystal oscillator 29 and K, N and R are the division factors of frequency dividers 23, 25 and 31, respectively.

Channels are selected by controlling the division factor N by which the programmable divider (÷N) 25 divides the frequency of the output signal of fixed divider (÷K) 23. Division factor K is selected to reduce the very high frequencies of the first LO signal to a range accommodating the operation by programmable(÷N) divider 25. The value of N is set by a ÷N control unit 35 which in turn is controlled by coded binary signals representing the channel number of the selected channel stored in a channel number register 37. The contents of channel number register 37 are entered by means of a calculator-like keyboard 39 when the user depresses digit keys corresponding to the tens and units digits of the channel number of the desired channel.

The purpose of PLL tuning control system 19 is to establish the frequency of the first LO signal in accordance with the selected channel so that the frequency of the picture carrier of the first IF signal is at its nominal value, e.g., 415.75 MHz. This assumes that the frequency of the picture carrier of the selected RF signal is exactly at its correct value. This is the case when RF source 1 is a broadcast receiving antenna. However, as earlier noted, when RF source 1 is a cable system, video tape or disk player, TV game, home computer or teletext system, the RF signals supplied to the television tuner are often shifted or offset in frequency because of frequency translations that occur in the RF source. The amount of such frequency offsets are unpredictable and accordingly the values of division factor N for the various channels cannot be set in advance to compensate for the frequency offsets of the RF signals by appropriately offsetting the frequencies of the first LO signal. Assuming that the frequency offsets of the RF signals are no greater than the control range of AFT circuit 21, by applying the automatic fine tuning voltage generated by automatic fine tuning circuit 21 to second LO 13 the frequency of the second LO signal can automatically shifted so that the frequency of the picture carrier of the second IF will be at its nominal value, e.g., 45.75 MHz, in the United States.

However, it will be appreciated that there may be frequency offsets of the RF signal greater than the control range of AFT circuit 21. To account for such frequency offsets PLL tuning control system 19 of FIG. 1 includes apparatus for changing the frequency of first LO 7 in discrete steps by changing the programmable division factor N of programmable divider 25 by respective discrete steps until the picture carrier of the standard IF signal produced at the output of mixer 11 is within the control range of AFT circuit 21. That apparatus will now be described.

When a new channel is selected, a "channel change" signal is generated by channel number register 37 in response to the entry of a new channel number. The channel change signal is coupled to a mode control unit 41 which in response to the channel change signal terminates an "AFT enable" signal to cause an electronic switch 43, by which the AFT is selectively coupled to the control voltage input of second LO 13, to substitute a fixed voltage for the AFT voltage to prevent the AFT voltage from controlling second LO 13 during the period in which PLL tuning control system 19 is changing the frequency of the first LO signal. This is done to minimize the possibility of incorrectly tuning second LO 13 since the AFT signal changes unpredictably in response to frequency changes of the first LO signal until the operation of PLL tuning control system 19 has been stabilized. Furthermore, in the embodiment shown in FIG. 1, the AFT voltage is not allowed to control the second LO 13 until the picture carrier of the second IF signal has been brought within the control range of the AFT signal by step-wise changing the frequency of the first LO signal in the manner to be described below.

A lock detector 45 is coupled to phase detector 27 for determining when the error pulses produced by phase detector 27 have a width less than a predetermined width indicative of the locked or stabilized condition of PLL tuning control system 19. When that occurs, lock detector 45 generates a "lock" signal which is coupled to mode control logic unit 41. Mode control logic unit 41 responds to the lock signal by initiating the operation of offset detector 47, which determines whether or not the picture carrier of the second IF signal is within the AFT control range. If the picture carrier of the second IF signal is within the AFT control range, switch 43 is caused to couple the AFT voltage to the control input of second LO 13 in response to the generation of an AFT enable signal by mode control unit 41. Thereafter, the frequency of the second LO signal is changed in response to the AFT voltage so that the picture carrier of the second IF signal is caused to be at its nominal frequency, e.g., 45.75 MHz. If the frequency of the picture carrier of the second IF signal is not within the AFT control range, offset detector 47 generates an "offset" signal. The offset signal is coupled to mode control unit 41. In response to the offset signal, mode control unit 41 generates an "advance" signal. The advance signal is coupled to a step control counter 49.

The contents of step control counter 49 determine, together with the contents of channel number register 37, division factor N of programmable counter 37. In response to the advance signal, the count of step control counter 49 is changed by one count which causes division factor N to change accordingly from the nominal value of N corresponding to the selected channel. Thereafter, the tuning voltage for first LO 7 is changed until the frequency of the first LO 7 is locked at the new value of N. When the lock signal is generated, the operation of offset detector 47 is initiated again. If an offset signal is again generated, division factor N is again changed. A number of such cycles at different values of N may be required to tune the RF signal for a selected channel. Step control counter 49 may cause division factor N to change by steps on alternate sides of the nominal value of N, e.g., +1, −1, +2 and −2. Step control counter 49 may also cause division factor N to change in a single direction from an offset value of N, e.g., +2. Smaller steps than 1, e.g., 0.5, may also be used. When a channel change signal is generated, step control counter 49 is reset.

The structure comprising PLL control system 19 including step control unit 49 may be constructed in similar fashion to the corresponding structure of the PLL control system disclosed in U.S. Pat. No. 4,031,549, issued June 21, 1977 in the names of Rast, Wine and Henderson, in U.S. Pat. No. 4,357,632 issued in the name of M. P. French on Nov. 2, 1982 or which is embodied in a type MM 58142 integrated circuit manufactured by National Semiconductor Corporation, Santa Clara, Calif.

The operation of offset detector 47 will now be described. During the following description reference to the waveform shown in FIGS. 1A and 1B will be helpful.

As earlier noted, when a channel change signal (a positive going pulse) is generated, mode control unit 41 causes the previously generated AFT enable signal (a high logic level) to be terminated (become a low logic level). This causes switch 43 to decouple the AFT voltage produced by AFT circuit 21 from the control voltage input of second LO 13 and to couple the output voltage of a ramp generator 51 to the control voltage input of second LO 13 instead. The operation of ramp generator 51 is controlled by the level of a ramp enable signal which in turn is generated by mode control unit 41. In response to the generation of the channel change signal, mode control unit 41 causes the ramp enable signal to be at the low logic level. This causes the output voltage of ramp generator 51 to be held at a fixed voltage level VO. In addition, a "PLL mode" signal generated by mode control unit 41 is caused to have the high logic level (indicating that the operation of PLL tuning control system 19 has not yet been stabilized). The PLL mode signal is coupled to the reset (R) input of a set-reset flip-flop (S-R FF) 53 included within a carrier detection portion 55 of offset detector 47. The high logic level of the PLL mode signal causes S-R FF 53 to be held in its reset state.

When the lock signal is generated by lock detector 45, mode control unit 41 causes the ramp enable signal to have the high logic level and the PLL mode signal to have the low logic level. The low logic level of the ramp enable signal causes ramp generator 51 to generate a negatively sloped ramp voltage starting at voltage level VO. The low logic level of the PLL mode signal enables S-R FF 53 to be set upon the application of the high logic level to its set (S) input.

At the VO level of the ramp voltage, second LO 13 is caused to oscillator at a frequency offset from its nominal frequency $f_{NLO2}$ (e.g., 370 MHz) by an amount slightly greater than the width of the lower portion (hump) of the AFT voltage (see FIG. 1B). As the ramp voltage decreases, the frequency of second LO 13 decreases and the frequency of the picture carrier of the second IF signal, if present for the nominal value of division factor N for the selected channel, increases. Ramp generator 51 is designed to ensure (unless not stopped in response to the presence of a carrier as will be described below) the ramp voltage will fall below a voltage level V3 in a short time (e.g., 100 milliseconds). If the ramp voltage falls below voltage level V3 before a "carrier found" signal is generated by the remaining structure of offset detector 47 to be described below, an offset signal will be generated by a voltage comparator 57. At voltage level V3, second LO 13 is caused to oscillate at a frequency offset from its nominal frequency $f_{NLO2}$ by an amount slightly greater than the width of the upper portion (hump) of the AFT voltage (see FIG. 1B). Thus, the ramp voltage causes the picture carrier, if present, to be swept through a range of frequencies corresponding to the AFT control range.

The offset signal causes mode control unit 41 to generate an advance signal (a positive-going pulse). It also causes the PLL mode signal to be at the high logic level (which causes S-R FF 53 to be held reset) and the ramp enable signal to be at the low logic level (which causes the ramp voltage to be at voltage level VO). When the lock signal is again generated, the PLL mode signal is caused to be at its low logic level (which enables S-R FF 53 to be set) and the ramp enable signal is caused to be at the high logic level (which starts the negatively sloped ramp voltage).

Figure 1A:
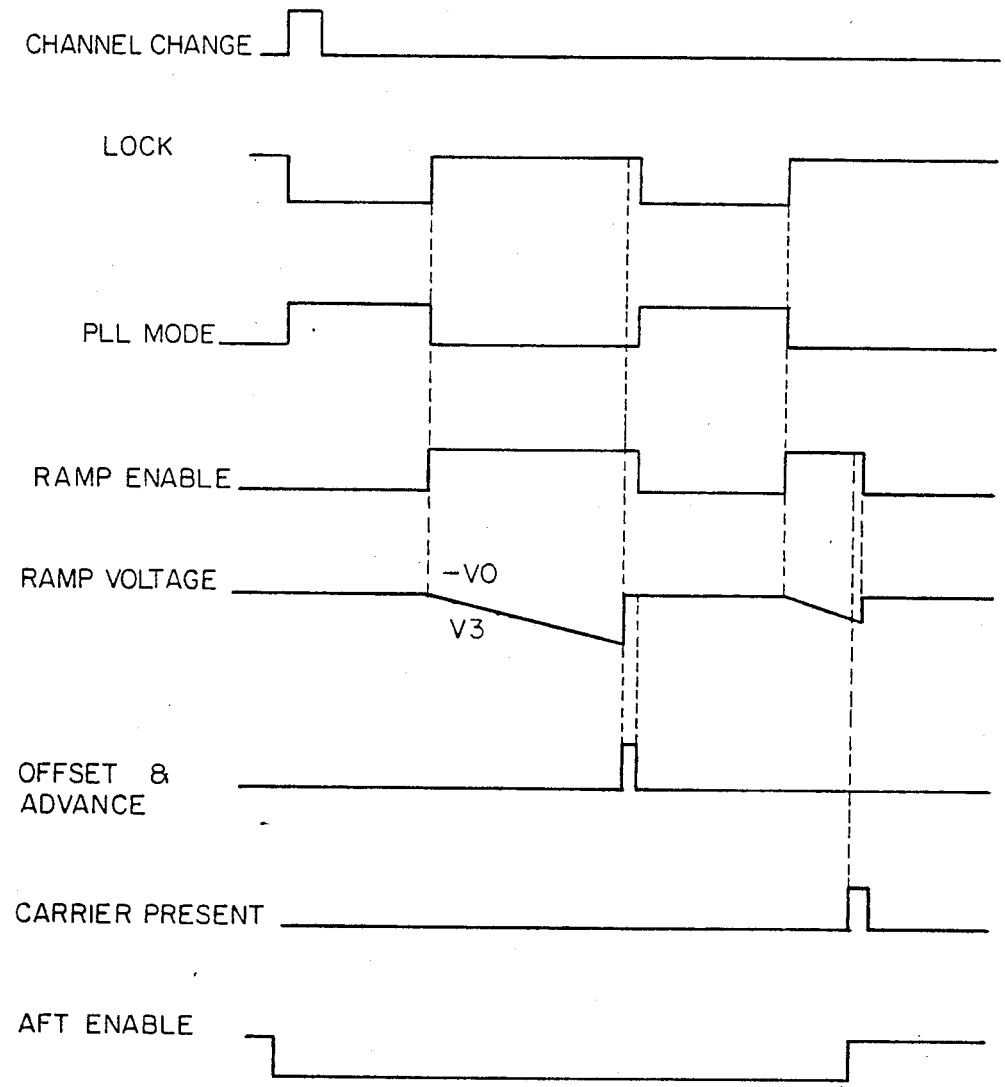
FIGS. 1A and 1B are graphical representation of signal waveforms useful in understanding the operation of the embodiment of the present invention shown in FIG. 1.
Figure 1B:
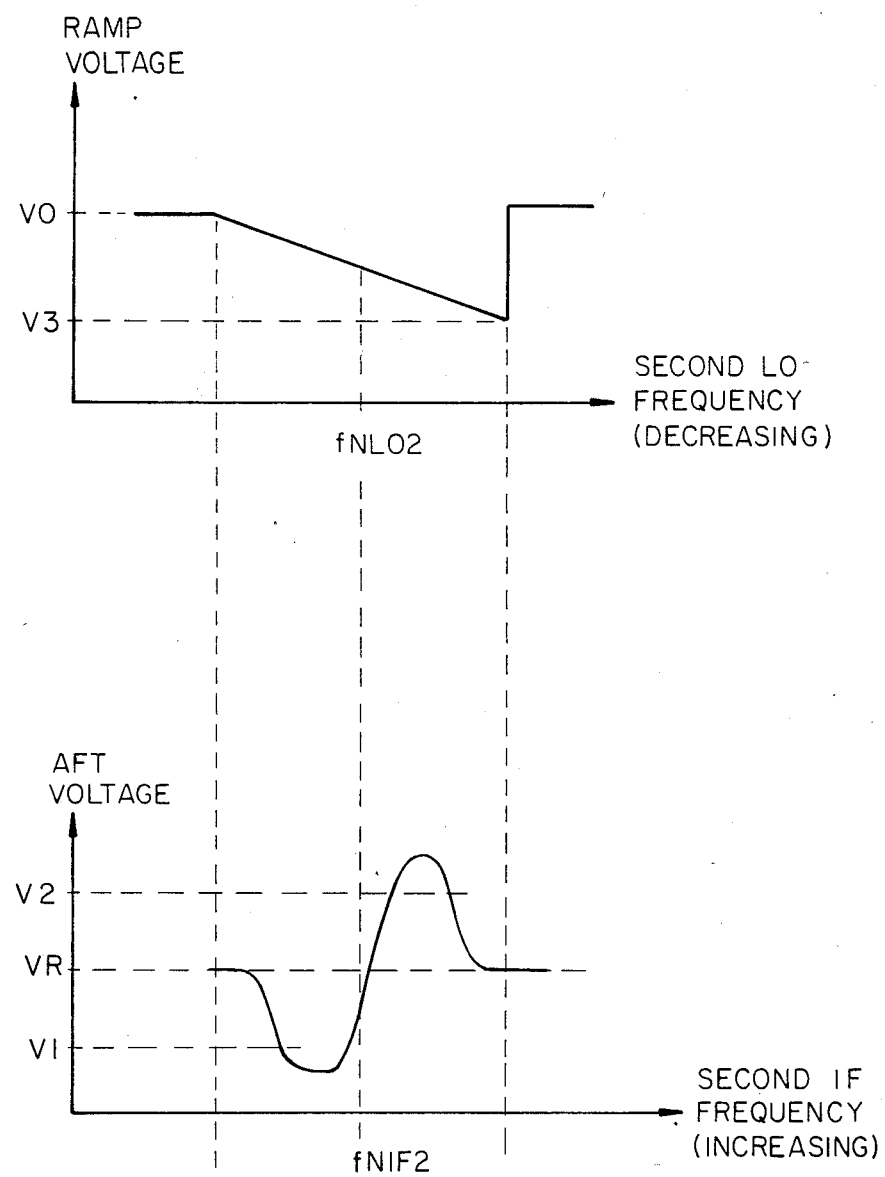

The operation of carrier detector portion 55 of offset detector 47 will now be described assuming that a carrier is present (i.e., near or within the AFT control range) for the new value of division factor N set in response to the generation of a offset signal during the previous cycle (as is shown in FIG. 1A). Carrier detector 55 determines if a picture carrier is present by determining if the amplitude of the AFT reaches the positively sloped portion between the negative and positive humps. For that purpose, carrier detector 55 includes a first voltage comparator 59 for generating a high logic level signal if the AFT voltage falls below a first voltage level V1 on the negatively sloped portion of the negative hump and a second voltage comparator 61 for generating a high logic level signal if the AFT voltage exceeds a second voltage level V2 on the positively sloped portion of the positive hump (see FIG. 1B). The output signal of first voltage comparator 59 is coupled to the set input of S-R FF 53. If the AFT voltage falls below voltage level V1, S-R FF 53 is set and an AND gate 63, having one input coupled to the Q output of S-R FF 53 and a second input coupled to the output of voltage comparator 62, is enabled. If thereafter, the AFT voltage exceeds voltage level V2, a "carrier present" signal (a high logic level) is produced at the output of AND gate 63.

In response to the carrier present signal, mode control unit 41 terminates the high logic level of the ramp enable signal, which terminates the ramp voltage and sets the output of ramp generator 51 to the voltage level VO, and generates the high logic level AFT enable signal. The latter causes switch 43 to decouple the output of ramp generator 51 from the control voltage input of second LO 13 and to couple the AFT voltage produced by AFT circuit 21 to the control votlage input of second L013 instead. This initiates the AFT control of second LO 13. Due to a capacitor 65 coupled in shunt with the control voltage input of second LO 13, which together with a resistor 67 connected in series with the output of AFT circuit 21 forms a low pass filter for the AFT voltage, the AFT control of second LO 13 starts from the level of the ramp voltage at which the presence of the picture carrier was detected.

Figure 1C:
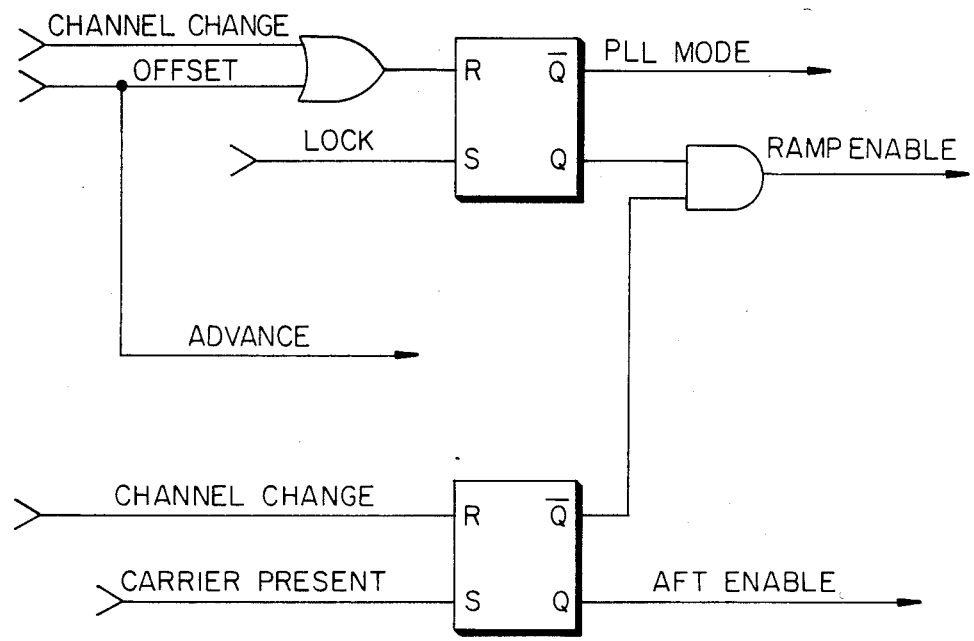
FIGS. 1C and 1D are detailed schematics of portions of the embodiment of the present invention shown in block form in FIG. 1.

A logic diagram of an embodiment of mode control unit 41 is shown in FIG. 1C. The operation of this stucture is easily understood with reference to the timing waveforms shown in FIG. 1A. It will be noted that the offset signal is used as the advance signal directly.

Figure 1D:
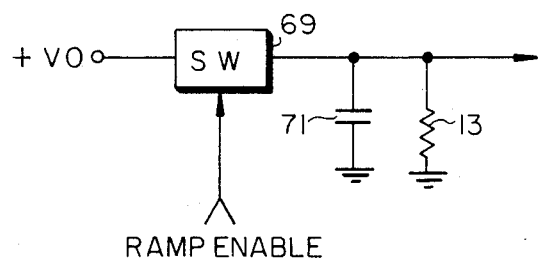

As shown in FIG. 1D ramp generator 51 may simply comprise a switch 69 connected in series between a source of positive DC voltage VO and the parallel combination of a capacitor 71 and a resistor 73. When the ramp enable signal is at the low logic level, switch 69 is conductive thereby coupling voltage VO to the output of ramp generator 51 and causing capacitor 71 to change to voltage level VO. When the ramp enable signal has its high logic level, switch 69 is non-conductive and capacitor 71 discharges from voltage level VO.

While it might be thought possible to merely apply the AFT voltage to second LO 13 after the generation of a lock signal and thereafter generate an offset signal if the AFT voltage is not betweeen voltage levels V1 and V2 (see FIG. 1B) at a predetermined time thereafter. However, this presents a problem in the situation where the picture carrier is beyond the humps of the AFT voltage so that AFT control starts at reference level VR. In that case, although the AFT voltage is incapable of bringing the picture carrier within the AFT control range, no offset signal is generated. The embodiment of FIG. 1 overcomes this problem by driving the second LO signal and thereby the second IF signal through a frequency range in which the AFT control range is expected to be encountered if the picture carrier of the second IF signal is present.

Figure 2:
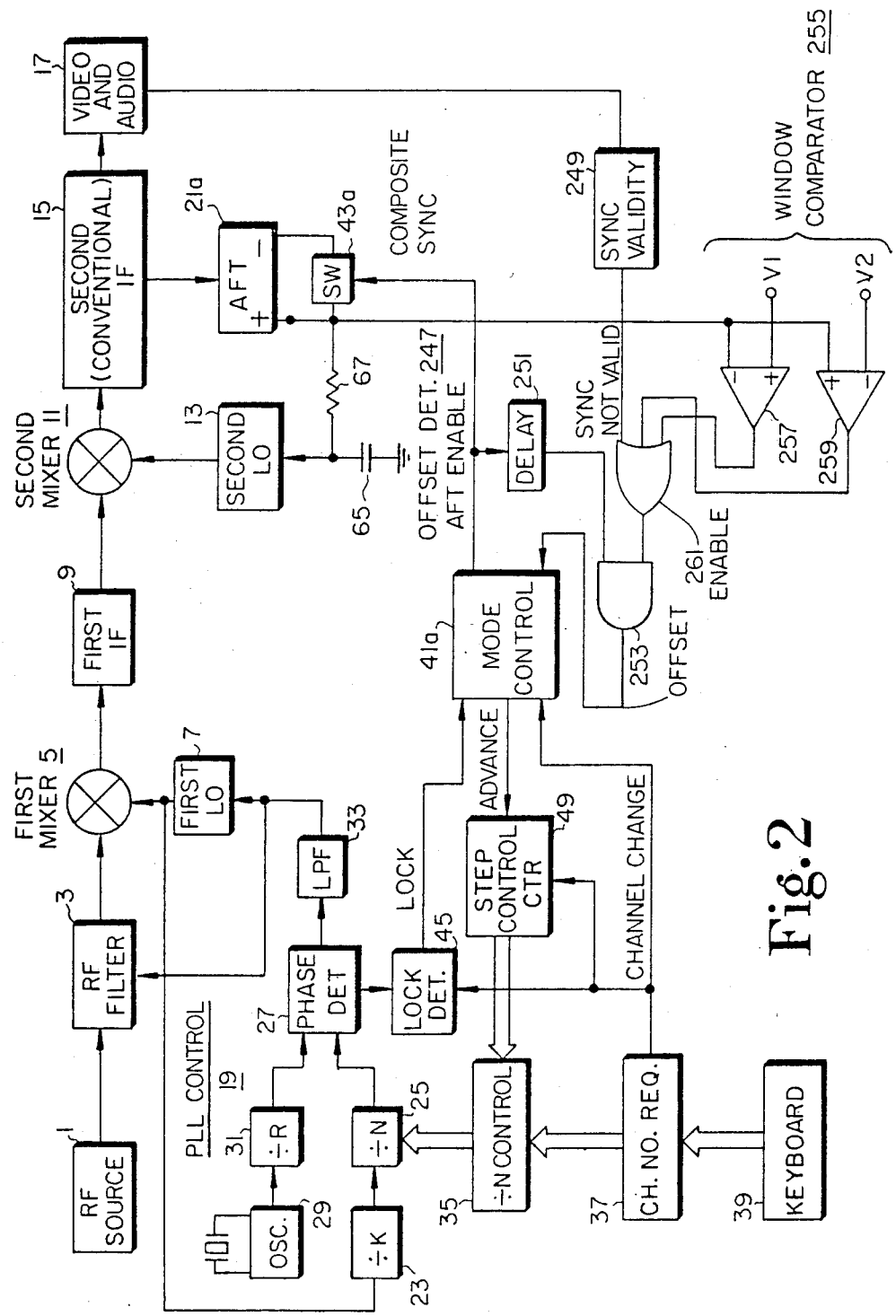
FIG. 2 is a schematic, partially in block form of a double conversion tuning system of a television receiver including another embodiment of the present invention.

In the embodiment shown in FIG. 2, the AFT voltage is allowed to control second LO 13 as soon as the lock signal is generated. However, the generation of an offset should the picture carrier be outside the humps of the AFT voltage does not present the problem described above since the offset detector is not responsive to the amplitude of the AFT voltage. Rather, the offset detector of the embodiment shown in FIG. 2 is responsive to the condition of the composite synchronization signal component of the video signal. As a result, the ramp generation structure of the embodiment of FIG. 1 is not needed.

In FIG. 2, elements which are identical to elements shown in FIG. 1 are identified by the same reference numbers, elements which are similar to, but not identical to, elements shown in FIG. 1 are identified by the same reference numbers followed by the letter "a" and new elements are identified with "200" series reference numbers.

In the embodiment of FIG. 2 single-ended output AFT circuit 21 is replaced with a double-ended output AFT circuit 21a which provides complementary AFT voltages of opposite polarity but with the same reference voltage level VR at respective positive (+) and negative (−) output terminals. The positive AFT voltage is coupled to the control voltage input of second LO 13. A switch 43a is connected between the positive and negative output terminals of AFT circuit 21a and its conduction is controlled in response to the AFT enable signal. When the AFT enable signal is absent, switch 43a is conductive thereby connecting the plus and minus output terminals of AFT circuit 21a together. This causes the AC components of the complementary AFT voltages to cancel each other so that only the reference voltage level VR is applied to the control input of second LO 13. During this period capacitor 65 charges to reference voltage level VR. Second LO 13 is designed so that it will oscillate at its nominal frequency (e.g., 370 MHz) in response to the AFT reference voltage level VR. When the AFT enable signal is present, switch 43a is non-conductive and the positive AFT voltage is applied to the control voltage input of second LO 13. However, because of capacitor 65, AFT control of second LO 13 starts at the AFT reference voltage level VR and initially, after the generation of the AFT enable signal, second LO 13 oscillates at its nominal frequency. The purpose of this switching arrangement is to start the AFT control of second LO 13 at its nominal frequency so that a reliable offset frequency measurement can be made by offset detector 247.

Offset detector 247 includes a "sync validity" detector 249 for generating a "sync not valid" signal (a high logic level) if the composite synchronization signal generated by a conventional sync separator within video and audio signal processing section 17 does not have the correct characteristics, i.e., is not "valid". At the predetermined time delay, e.g., 50 milliseconds, after the generation of an AFT enable signal, an "enable" signal is generated by a delay circuit 251 which may simply comprise two cascaded monostable multivibrators. The enable signal enables an AND gate 253 to couple the high logic level "sync not valid" signal, if it is generated, to mode control unit 41a as the offset signal. A suitable arrangement for sync validity detector 249 is disclosed in U.S. Pat. No. 4,364,094 issued in the names of M. P. French and J. Tults on Dec. 14, 1982.

If desired, the reliability of the generation of the offset signal may be enhanced by using a "window" comparator 255 which determines if the amplitude of the AFT voltage is outside of the amplitude window between voltage levels V1 and V2 (see FIG. 1B) in combination with sync validity detector 249. The outputs of voltage comparators 257 and 259 comprising window comparator 255 and the output of sync validity detector 249 are coupled to respective outputs of an OR gate 261. The output of OR gate 261 is coupled to an input of AND gate 253. If either the composite synchronization signal is not valid or the AFT voltage is not between levels V1 and V2 when the enable signal is generated, an offset signal will be generated at the output of AND gate 253. It is noted that the aforementioned problem due to the AFT voltage having reference voltage VR both inside and outside its control range is avoided in the embodiment of FIG. 2 because of the presence of sync validity detector 249.

Figure 2A:
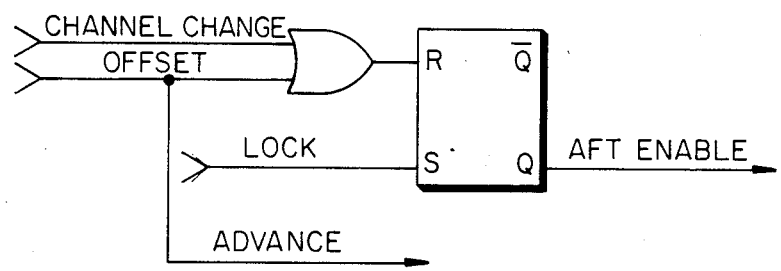
FIG. 2A is a detailed schematic of a portion of the embodiment of the present invention shown in block form in FIG. 2.

Mode control unit 41a of the embodiment show in FIG. 2 may be constructed as shown in FIG. 2A.

In the present arrangement under steady-state operating conditions, i.e., when PLL tuning control system 19 has locked the frequency of first LO 7 to that of crystal oscillator 19 and the AFT signal has controlled second local oscillator 13 to bring the picture carrier of the second IF signal to its nominal frequency, not only is the frequency offset of the selected RF signal corrected but, in addition, the drift both local oscillators is substantially eliminated since both local oscillators are included in respective closed tuning control loops. That would not be the case if the AFT voltage were applied to first LO 7 since second LO 13 would be free to drift. Moreover, by applying the AFT voltage to second L0 13 there is no compensation required to account for changes of the AFT sensitivity from channel to channel and from tuning band to tuning band discussed earlier since the frequency of second LO 13 does not change as a function of the channel selected. This advantage would not result if the AFT voltage were applied to first LO 7 rather than to second LO 13 since the frequency of first LO 7 changes as a function of the channel selected. Further, since the frequency of first L07 is not adjusted in response to the AFT voltage to compensate for frequency drifts of second L013, the frequency of the first IF signal will be correct and fall within the passband of first IF section 9. This is important if first IF section 9 is relatively narrowband, e.g., for the reduction of noise or when first IF section 9 comprises a surface acoustic wave device.

With reference to FIG. 1 it is noted that the tuning control voltage generated by PLL tuning control system 19 and coupled to first LO 7 is also coupled to RF section 3 (which includes a tunable filter) so that RF section 3 tracks the tuning of first local oscillator 7 in accordance with the channel selected. The AFT voltage generated by AFT circuit 21 is not coupled to RF section 3. This presents no real problem since the bandwidth of the tunable filter included in RF section 3 is wide enough to account for any frequency offsets of the received RF signals which would otherwise be corrected by the AFT voltage.

We claim:

1. Apparatus for tuning a receiver to various RF signals corresponding to respective channels, each RF signal having at least one information bearing carrier, comprising:

RF input means for providing one of said RF signals;

first local oscillator means for generating a first local oscillator signal having a frequency controlled in response to the amplitude of a first control signal applied to a first control input;

channel selection means for selecting one of said channels;

first local oscillator control means coupled to said channel selection means for generating said first control signal in accordance with the selected channel;

completion indicating means coupled to said first oscillator control means and to said channel selection means for generating a completion signal indicating when said first control signal is substantially stabilized after a new channel has been selected;

first mixer means for mixing said RF signal and said first local oscillator signal to produce a first IF signal;

second local oscillator means for generating a second local oscillator signal having a frequency controlled in response to the amplitude to a second control signal applied to a second control input;

second mixer means for mixing said first IF signal and said second local oscillator signal to produce a second IF signal, said second IF signal having at least one information bearing carrier corresponding to the information bearing carrier of said RF signal, said information bearing carrier of said IF signal having a nominal value;

automatic fine tuning (AFT) means generating an AFT signal having an amplitude representing the deviation, if any, of the frequency of said information bearing carrier of said second IF signal from said nominal value; and AFT coupling control means coupled to said completion indicating means for selectively coupling said AFT signal to said control input of said second local oscillator means so that said AFT signal is allowed to control the frequency of said second local oscillator signal as said second control signal after the generation of said completion signal.

2. The apparatus recited in claim 1 wherein:

said first local oscillator control means includes a closed loop control means for controlling the amplitude of said first control signal to establish a predetermined relationship between the frequency of said first local oscillator signal and a reference value.

3. The apparatus received in claim 2 wherein:

said closed loop control system continues to control the frequency of said first local oscillator signal after the generation of said completion signal.

4. The apparatus recited in claim 2 wherein:

said AFT coupling control means includes offset detector means responsive to said second IF signal and coupled to said completion indicating means for generating an offset signal if the frequency of said carrier of said second IF signal falls outside a predetermined range of said nominal value after the generation of said completion signal; and said closed loop control means changes said predetermined relationship between the frequency of said first local oscillator and said reference value in response to said offset signal.

5. The apparatus recited in claim 4 wherein:

said AFT coupling means includes initialization means coupled to said channel selection means and to said completion indicating means for setting the amplitude of said second control signal to a predetermined amplitude level after a new channel has been selected until the generation of said completion signal.

6. The apparatus recited in claim 5 wherein:

said AFT coupling means is responsive to the absence of said offset signal after the generation of said completion signal for allowing said AFT signal to control the frequency of said second local oscillator signal.

7. The apparatus recited in claim 6 wherein:

said offset detector includes ramp signal generating means for selectively coupling a ramp signal to said second control input as said second control signal in response to the generation of said completion signal; and amplitude comparator means responsive to the amplitude of said AFT signal and to the amplitude of said ramp signal for generating said offset signal if the amplitude of said AFT signal is not within a predetermined amplitude range when the amplitude of said ramp signal reaches a predetermined level.

8. The apparatus recited in claim 5 wherein:

said AFT coupling means is responsive to said completion signal for allowing said AFT signal to control the frequency of said second local oscillator signal immediately after the generation of said completion signal and is responsive to the generation of said offset signal thereafter for disabling said AFT signal from controlling the frequency of said second local oscillator signal.

9. The apparatus recited in claim 8 wherein:

said information bearing varrier of said second IF signal is a picture carrier modulated with a video signal including a synchronization signal component; and said offset detector means includes sync comparision means responsive to said synchronization signal component and coupled to said completion indicating means for generating said offset if said synchronization signal component is not correct at a predetermined time after the generation of said completion signal.

10. The apparatus recited in claim 9 wherein:

said initialization means couples a DC signal substantially equal to the amplitude of said AFT signal which represents substantially no deviation between the frequency of said picture carrier and said nominal value to said second control input as said second control signal after a new channel has been selected until the generation of said completion signal.

11. The apparatus recited in claim 9 wherein:

said AFT means provides two completmentary AFT signals referenced to the same reference level at respective outputs, said reference level being substantially equal to the amplitude of each of said complementary AFT signals which represents substantially no deviation between the frequency of said information bearing carrier and said nominal value, one of said outputs being connected to said second control input;

and said initialization means includes switch means for coupling said outputs of said AFT means together after a new channel has been selected and decoupling said outputs of said AFT means from one another when said completion signal is generated.

12. The apparatus recited in claim 4 wherein:

said closed loop means is a phase locked loop means for controlling the amplitude of said first control signal to establish the frequency of said first local oscillator signal in a proportional relationship to a reference frequency by a programmable proportion factor, said phase locked loop means including proportional factor control means coupled to said channel selection means for setting said programmable proportion factor in accordance with said selected channel and coupled to said offset detector for changing said proportion factor in response to said offset signal.

13. The apparatus recited in claim 12 wherein:

said completion indicating means includes lock detector means coupled to said phase locked loop means for generating said completion signal when said proportional relationship is established after said proportion factor is changed.

14. A double conversion tuner including:

an RF input for providing an RF signal;

a first controllable local oscillator for generating a first local oscillator signal having a controllable frequency in response to the amplitude of a first control signal;

a first mixer for combining said RF signal and said first local oscillator signal to produce a first IF signal;

a second controllable local oscillator for generating a second local oscillator signal having a controllable frequency in response to the amplitude of a second control signal;

a second mixer for combining said first IF signal and said second local oscillator signal to produce a second IF signal;

an automatic fine tuning (AFT) circuit for generating an AFT signal having an aplitude representing the deviation, if any, between the frequency of the second IF signal and a nominal value;

closed loop control means for generating said first control signal and for controlling its amplitude to establish a proportional relationship between the frequency of said first local oscillator signal and a reference value;

completion indicating means coupled to said closed loop means for generating a completion signal indicating the establishment of said proportional relationship between the frequency of said first local oscillator signal and said reference value;

switching means coupled to said completion indicating means for selectively allowing said second local oscillator to be controlled in response to said AFT signal as said second control signal to establish the frequency of said second IF signal at said nominal value after the generation of said completion signal.

15. The apparatus recited in claim 14 wherein said closed loop control system includes a phase locked loop.

16. The apparatus recited in claim 14 wherein:

said switching means selectively causes a predetermined DC level to be applied to said second local oscillator as said second control signal before the generation of said completion signal.

* * * * *